United States Patent
Tsuchiya

(10) Patent No.: US 9,136,407 B2
(45) Date of Patent: Sep. 15, 2015

(54) SOLID-STATE IMAGE SENSOR, METHOD OF MANUFACTURING THE SAME, AND CAMERA

(71) Applicant: CANON KABUSHIKI KAISHA, Tokyo (JP)

(72) Inventor: Masayuki Tsuchiya, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 20 days.

(21) Appl. No.: 14/026,460

(22) Filed: Sep. 13, 2013

(65) Prior Publication Data
US 2014/0078337 A1    Mar. 20, 2014

(30) Foreign Application Priority Data
Sep. 19, 2012   (JP) ................. 2012-206314

(51) Int. Cl.
    H01L 21/00      (2006.01)
    H01L 31/0232    (2014.01)
    H01L 31/18      (2006.01)
    H01L 27/146     (2006.01)

(52) U.S. Cl.
    CPC ...... *H01L 31/02327* (2013.01); *H01L 27/1461* (2013.01); *H01L 27/14689* (2013.01); *H01L 31/18* (2013.01)

(58) Field of Classification Search
    None
    See application file for complete search history.

(56) References Cited

U.S. PATENT DOCUMENTS

| 7,719,040 B2 | 5/2010 | Nagasaki et al. |
| 8,076,225 B2 | 12/2011 | Nakashima |
| 8,349,640 B2 | 1/2013 | Soda |
| 2006/0240631 A1 | 10/2006 | Kawasaki |
| 2011/0294251 A1* | 12/2011 | Soda ............................. 438/73 |
| 2014/0300786 A1* | 10/2014 | Okita et al. ................... 348/294 |

FOREIGN PATENT DOCUMENTS

| JP | 06-209099 A | 7/1994 |
| JP | 2006-303328 A | 11/2006 |
| JP | 2007-067379 A | 3/2007 |
| JP | 2007-150290 A | 6/2007 |
| JP | 2011-249680 A | 12/2011 |

* cited by examiner

*Primary Examiner* — Yasser A Abdelaziez
(74) *Attorney, Agent, or Firm* — Fitzpatrick, Cella, Harper & Scinto

(57) ABSTRACT

A method of manufacturing a solid-state image sensor having a first charge accumulation region, a second charge accumulation region, includes implanting ions into a semiconductor substrate through first and second openings of a mask to form the first and second charge accumulation regions. The implanting ions includes a first implantation of implanting ions into a portion below a first transfer gate, and a second implantation of implanting ions into a portion below a second transfer gate in a direction different from a direction of the first implantation.

8 Claims, 7 Drawing Sheets

US 9,136,407 B2

SOLID-STATE IMAGE SENSOR, METHOD OF MANUFACTURING THE SAME, AND CAMERA

BACKGROUND OF THE INVENTION

1. Field of the Invention

The present disclosure includes disclosure which relates to a solid-state image sensor, a method of manufacturing the same, and a camera.

2. Description of the Related Art

Patent literature 1 (Japanese Patent Laid-Open No. 6-209099) discloses the arrangement of a CCD solid-state image sensing element, and a method of manufacturing the same. A solid-state image sensor described in patent literature 1 has an $N^+$-type impurity layer 5 isolated by a $P^{++}$-type channel stopper layer 8 formed near the surface of a substrate, and an $N^-$-type impurity layer 6 formed under transfer gate electrodes 10 to be adjacent to the $N^+$-type impurity layer 5. In the manufacturing method described in patent literature 1, after the $P^{++}$-type channel stopper layer 8 is formed near the surface of the substrate, phosphorus ions are implanted, into the region where a plurality of photoelectric converters are to be formed between a pair of transfer gate electrodes 10, at an implantation angle of 15° to form the $N^-$-type impurity layer 6. At this time, phosphorus ions are implanted into the portion below one of the pair of transfer gate electrodes 10. Then, phosphorus ions are implanted, into the region where a plurality of photoelectric converters are formed between a pair of transfer gate electrodes 10, at an implantation angle of 15° to form the $N^+$-type impurity layer 5and $N^-$-type impurity layer 6. At this time, phosphorus ions are implanted into the portion below the other of the pair of transfer gate electrodes 10.

In the solid-state image sensor described in patent literature 1, the $N^+$-type impurity layer 5 is isolated by the $P^{++}$-type channel stopper layer 8 formed near the surface of the substrate, but the $N^+$-type impurity layer 5 extends across a plurality of photoelectric converters under the $P^{++}$-type channel stopper layer 8. Therefore, signals may mix between a plurality of photoelectric converters (pixels), thus leading to degradation in resolution and a mixture of colors.

SUMMARY OF THE INVENTION

The present invention provides a technique advantageous in terms of isolation between pixels.

One of aspects of the present invention provides a method of manufacturing a solid-state image sensor including a first charge accumulation region formed in an active region, a second charge accumulation region formed in the active region, a first transfer gate configured to transfer a charge in the first charge accumulation region, and a second transfer gate configured to transfer a charge in the second charge accumulation region, the method comprising: preparing a semiconductor substrate provided with the first transfer gate and the second transfer gate; forming, on the semiconductor substrate, a mask pattern including a first opening configured to implant ions into a region where the first charge accumulation region is to be formed, a second opening configured to implant ions into a region where the second charge accumulation region is to be formed, and a wall portion which is positioned between the first opening and the second opening, and is positioned on the active region; and implanting the ions into the semiconductor substrate through the first opening and the second opening to form the first charge accumulation region and the second charge accumulation region, wherein the forming the first charge accumulation region and the second charge accumulation region includes: a first implantation of implanting ions into the semiconductor substrate so as to implant ions into a portion below the first transfer gate; and a second implantation of implanting ions into the semiconductor substrate so as to implant ions into a portion below the second transfer gate in a direction different from a direction of the first implantation.

Further features of the present invention will become apparent from the following description of exemplary embodiments with reference to the attached drawings.

DESCRIPTION OF THE EMBODIMENTS

A solid-state image sensor according to an embodiment of the present invention can be implemented by, for example, a MOS image sensor or a CCD image sensor. The MOS image sensor can include a pixel array in which a plurality of pixels are arrayed to form a plurality of rows and a plurality of columns. The MOS image sensor can also include a row selecting circuit which selects a row in a pixel array, and a readout circuit which reads out signals output from pixels via column signal lines arranged on a plurality of columns in a pixel portion. The MOS image sensor can also include a horizontal selecting circuit which sequentially selects a plurality of signals read out by the readout circuit, and an output amplifier which outputs the signals selected by the horizontal selecting circuit.

Figure 8:
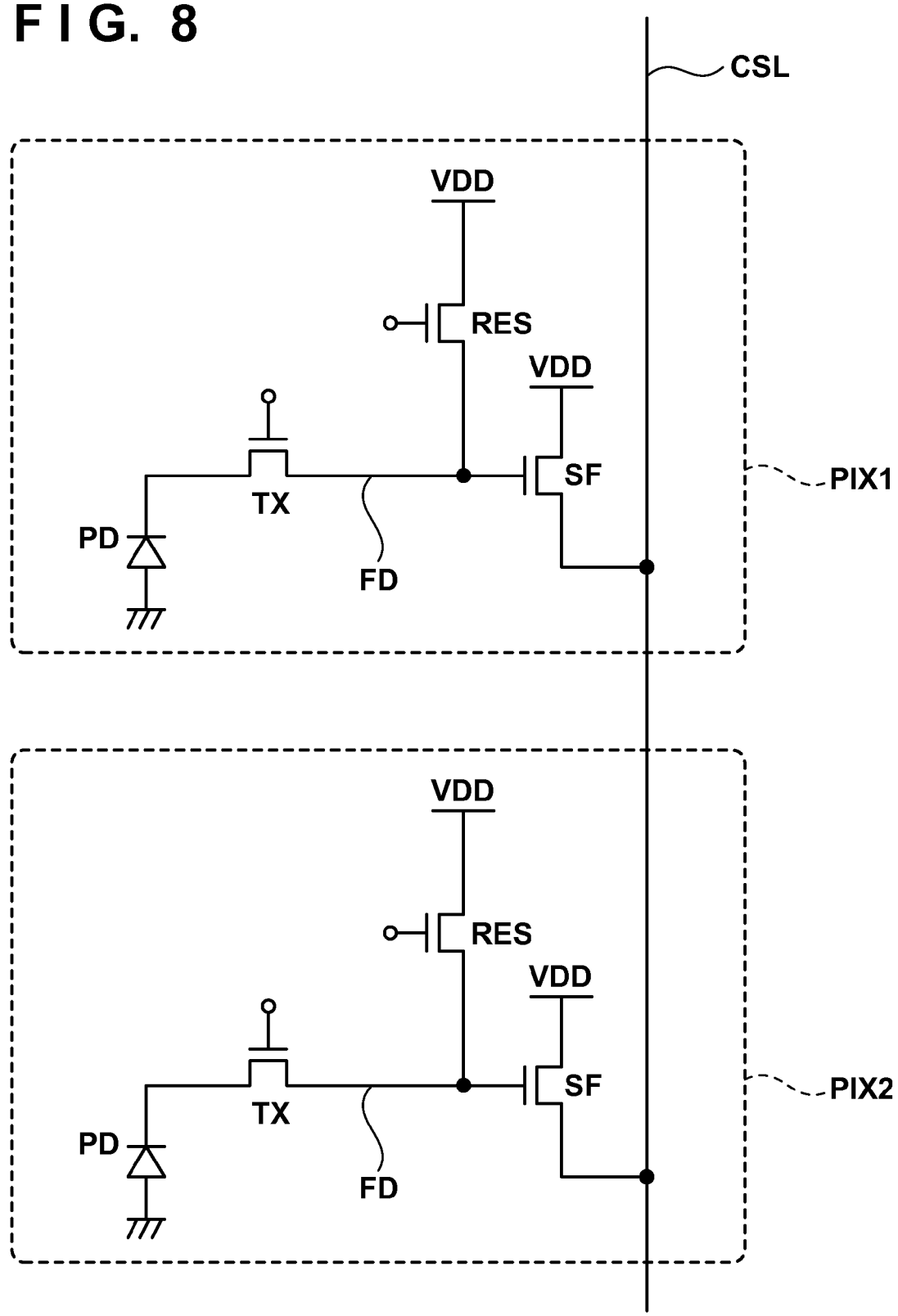
FIG. 8 is a circuit diagram illustrating an example of the arrangement of two pixels among a plurality of pixels which form a pixel array of a MOS image sensor.

FIG. 8 illustrates an example of the arrangement of two pixels (a first pixel PIX1 and second pixel PIX2) among a plurality of pixels which form a pixel array of a MOS image sensor. The first pixel PIX1 and second pixel PIX2 include photoelectric converters (photodiodes) PD including at least charge accumulation portions. Referring to FIG. 8, each of the first pixel PIX1 and second pixel PIX2 includes a charge-voltage converter FD, and a transfer gate TX which transfers charges from the charge accumulation portion to the charge-voltage converter FD. Each of the first pixel PIX1 and second pixel PIX2 can also include a reset transistor RES which resets the potential of the charge-voltage converter FD, and an amplifier transistor SF which outputs a signal corresponding to the potential of the charge-voltage converter FD to a column signal line CSL. In this case, the reset transistor RES, charge-voltage converter FD, and amplifier transistor SF may be shared by a plurality of pixels. The first pixel PIX1 and second pixel PIX2 may include selecting transistors.

A CCD image sensor can include a pixel array in which a plurality of photoelectric converters and a plurality of vertical CCDs are arrayed, and a horizontal CCD which transfers signals transferred via the plurality of vertical CCDs of the pixel array. The photoelectric converter includes a charge accumulation region, and charges accumulated in the charge accumulation region are transferred to the vertical CCD via a transfer gate.

Figure 1:
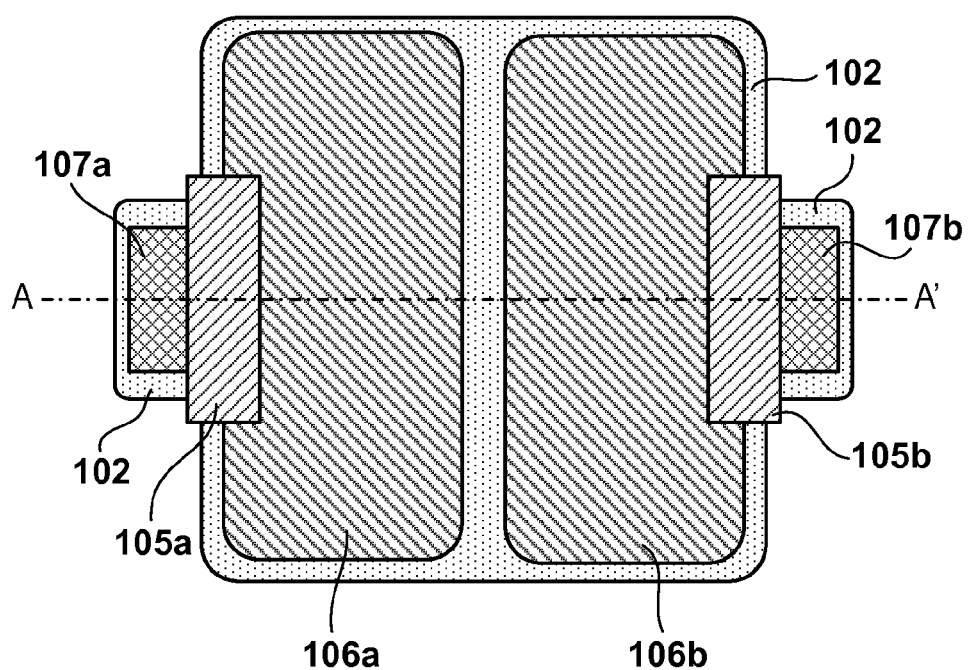
FIG. 1 is a plan view showing the partial arrangement of a pixel array of a solid-state image sensor according to the first embodiment of the present invention.
Figure 2:
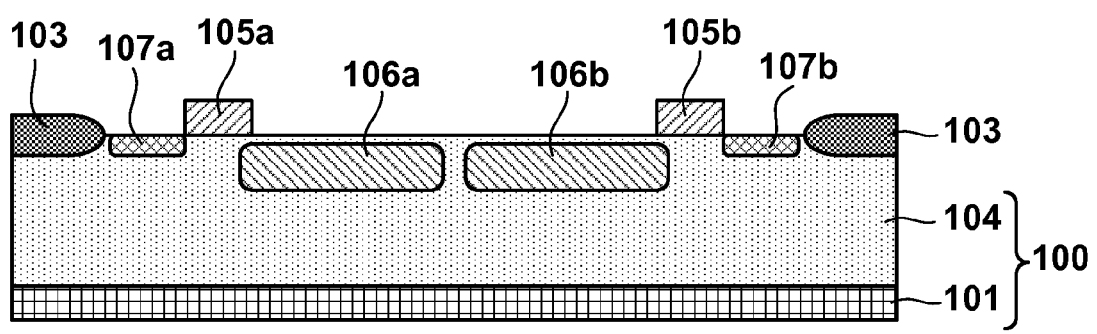
FIG. 2 is a sectional view showing the partial arrangement of the pixel array of the solid-state image sensor according to the first embodiment of the present invention.

FIG. 1 is a plan view showing the partial arrangement of a pixel array of a solid-state image sensor according to the first embodiment of the present invention, and FIG. 2 is a sectional view taken along a line A-A' in FIG. 1. FIGS. 1 and 2 show the photoelectric converters and transfer gates of two pixels (first and second pixels). The first pixel includes a first photoelectric converter including a first charge accumulation region 106a, and a first transfer gate 105a which transfers charges accumulated in the first charge accumulation region 106a to a first charge-voltage converter 107a. The second pixel includes a second photoelectric converter including a second charge accumulation region 106b, and a second transfer gate 105b which transfers charges accumulated in the second charge accumulation region 106b to a second charge-voltage converter 107b. The first photoelectric converter can be formed by the first charge accumulation region 106a, and a well 104 present below it. The second photoelectric converter can be formed by the second charge accumulation region 106b, and the well 104 present below it. As shown in FIG. 1, for example, in a plan view when viewed from the direction of a normal line to the surface of the semiconductor substrate, the first charge accumulation region 106a and first transfer gate 105a are arranged in a first direction (leftward direction) with reference to the region between the first charge accumulation region 106a and the second charge accumulation region 106b. Similarly, the second charge accumulation region 106b and second transfer gate 105b are arranged in a second direction (rightward direction) opposite to the first direction with reference to the region between the first charge accumulation region 106a and the second charge accumulation region 106b.

The first charge accumulation region 106a, second charge accumulation region 106b, first charge-voltage converter 107a, and second charge-voltage converter 107b are arranged in an active region 102. In the active region 102, element isolation 103 of the surface region of the well (semiconductor region) 104 of a second conductivity type arranged on a semiconductor region 101 of a first conductivity type is not arranged. In this case, the first conductivity type is N type while the second conductivity type is P type, but the first conductivity type may be P type while the second conductivity type is N type.

A method of manufacturing a solid-state image sensor according to the first embodiment will be described below with reference to FIGS. 3A to 3C and 4A to 4D. In the following description, the same reference numerals denote the same members before and after processing. In the step shown in FIG. 3A, a semiconductor substrate 100 of the first conductivity type (N type in this example) is prepared, a nitride film is formed on the semiconductor substrate 100, and a resist pattern is formed on the nitride film by patterning using photolithography. The resist pattern has an opening in a region where element isolation is to be formed on the semiconductor substrate 100. Using the resist pattern as an etching mask, the nitride film is patterned to form a nitride film pattern. The surface of the semiconductor substrate 100 is thermally oxidized using the nitride film pattern as an oxidation inhibition mask to form the element isolation 103. Such a method is called the LOCOS method, but the element isolation 103 may be formed using the STI method. Ions (boron ions in this example) for forming a region of a second conductivity type (P type in this example) are implanted into the region where the well 104 of the semiconductor substrate 100 having the element isolation 103 formed on it is to be formed. This ion implantation may be done by one ion implantation step, or may be done by a plurality of ion implantation steps while changing the ion implantation energy and the impurity concentration. With this operation, the well 104 of the second conductivity type is formed on the semiconductor region 101 of the first conductivity type. Note that in the semiconductor region 101 of the first conductivity type, no well is formed on the semiconductor substrate 100. This makes it possible to prepare a semiconductor substrate 100 including the element isolation 103, well 104, and semiconductor region 101.

Figure 3A:
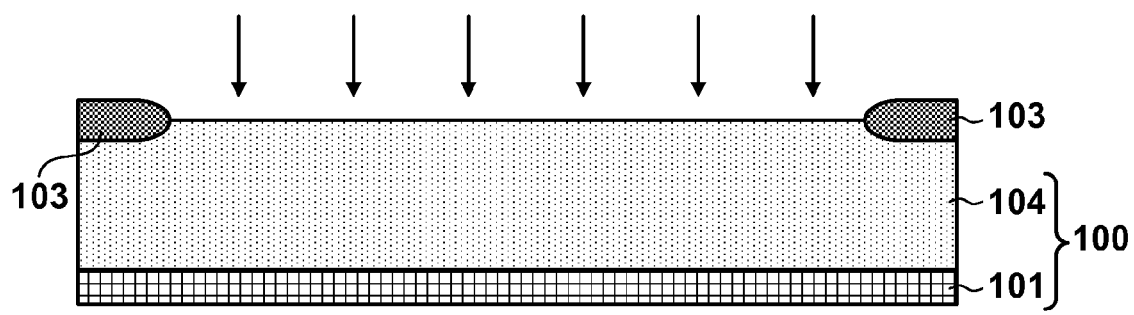
FIGS. 3A to 3C are sectional views for explaining a method of manufacturing a solid-state image sensor according to the first embodiment of the present invention.
Figure 3B:
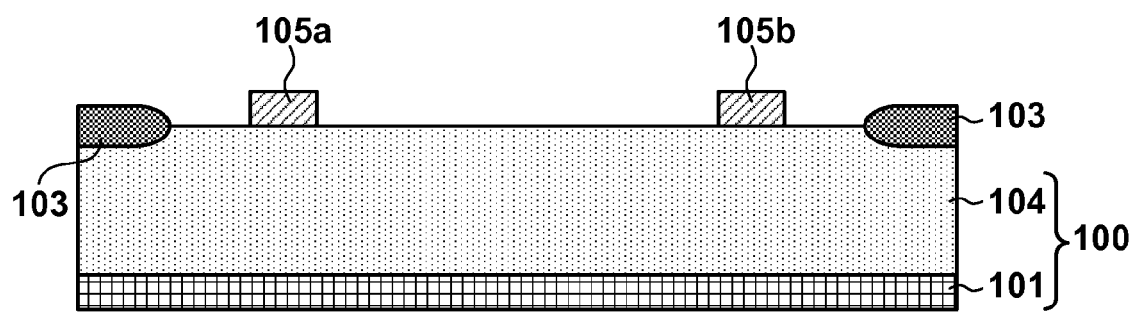

In the step (transfer gate forming step) shown in FIG. 3B, a polysilicon film is formed on the surface of the semiconductor substrate 100 (the surface of the well 104) through a gate insulating film (not shown). The polysilicon film is patterned to form the first transfer gate 105a and second transfer gate 105b.

Figure 3C:
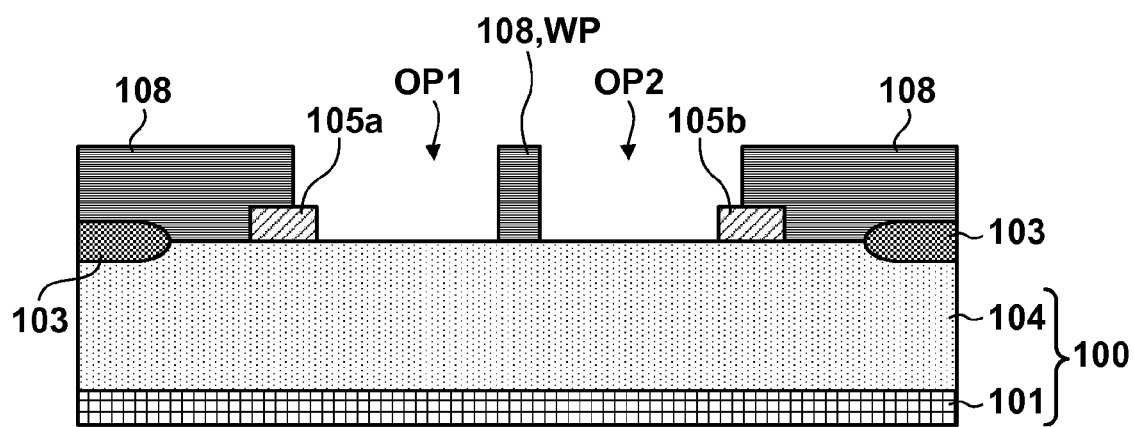

In the step (mask pattern forming step) shown in FIG. 3C, a mask pattern 108 is formed on the semiconductor substrate 100 having the first transfer gate 105a and second transfer gate 105b formed on it. The mask pattern 108 can be formed by, for example, the photolithography step. The mask pattern is, for example, a resist. The mask pattern 108 has a first opening OP1 for implanting ions into the region where the first charge accumulation region 106a is to be formed, and a second opening OP2 for implanting ions into the region where the second charge accumulation region 106b is to be formed. Note that the first opening OP1 and second opening OP2 are arranged to have a wall portion WP between them.

Figure 4A:
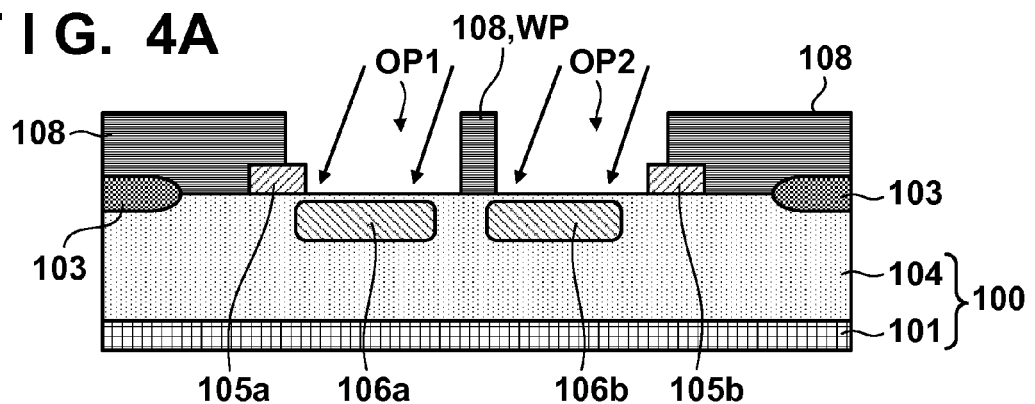
FIGS. 4A to 4D are sectional views for explaining a method of manufacturing a solid-state image sensor according to the first embodiment of the present invention.
Figure 4B:
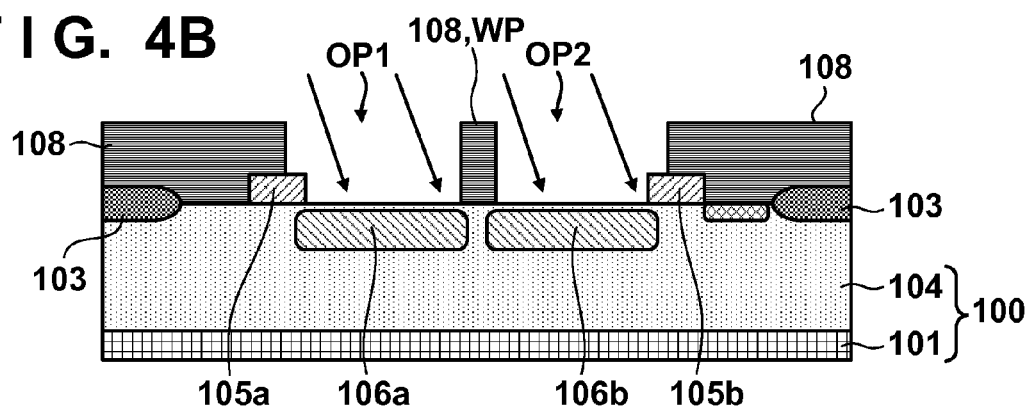

In the step (charge accumulation region forming step) shown in FIGS. 4A and 4B, ions (arsenic or phosphorus in this example) for forming a region of the first conductivity type are implanted into the semiconductor substrate 100 (well 104) through the first opening OP1 and second opening OP2. With this operation, the first charge accumulation region 106a and second charge accumulation region 106b are formed. Note that the charge accumulation region forming step can include a first implantation step shown in FIG. 4A, and a second implantation step shown in FIG. 4B. In the first implantation step shown in FIG. 4A, ions are implanted into the semiconductor region 101 (well 104) through the first opening OP1 and second opening OP2 in the direction in which ions are implanted into the portion below the first transfer gate 105a. In the second implantation step shown in FIG. 4B, ions are implanted into the semiconductor region 101 (well 104) through the first opening OP1 and second opening OP2 in the direction in which ions are implanted into the portion below the second transfer gate 105b. With this operation, the first charge accumulation region 106a has a shape including the portion arranged below the first transfer gate 105a, while the second charge accumulation region 106b has a shape including the portion arranged below the second transfer gate 105b.

Note that since the first opening OP1 and second opening OP2 are arranged to have the wall portion WP between them, neither a path nor a region which short-circuits the first charge accumulation region 106a and second charge accumulation region 106b is formed between them. Therefore, the first embodiment is advantageous in isolation between pixels, and is, in turn, advantageous in, for example, prevention of degradation in resolution and a mixture of colors. The width of the wall portion WP (the interval between the first opening OP1 and the second opening OP2) can be determined so that the interval between the first charge accumulation region 106a and the second charge accumulation region 106b falls within the range of, for example, 0.3 µm to 0.6 µm.

Figure 4C:
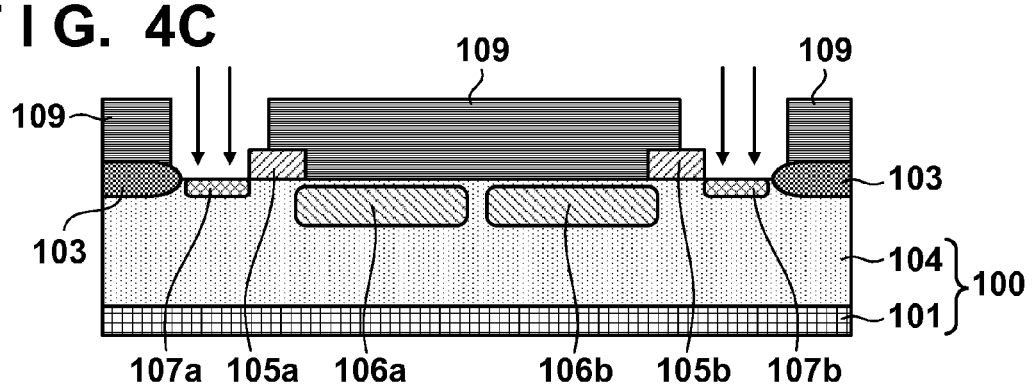
Figure 4D:
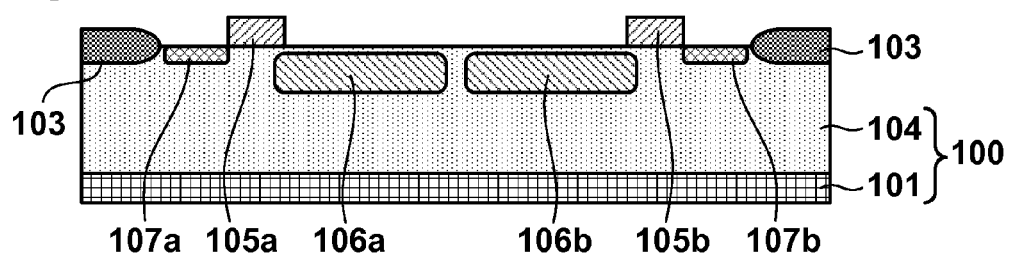

In the step shown in FIG. 4C, a mask pattern 109 is formed on the semiconductor substrate 100 by the photolithography step. Ions for forming a region of the first conductivity type (N type in this example) are implanted into the semiconductor substrate 100 (well 104) through an opening in the mask pattern 109. With this operation, the first charge-voltage converter 107a and second charge-voltage converter 107b are formed. The ion implantation step shown in FIGS. 4A to 4C may follow the annealing step. In the step shown in FIG. 4D, the mask pattern 109 is removed.

The second embodiment of the present invention will be described with reference to FIG. 5. The second embodiment is a modification to the first embodiment, and details which are not particularly referred to herein can be the same as in the first embodiment. In the second embodiment, the step (third implantation step) shown in FIG. 5 is executed in the step (that is, the charge accumulation region forming step) after the step (mask pattern forming step) shown in FIG. 3C and before that shown in FIG. 4C.

Figure 5:
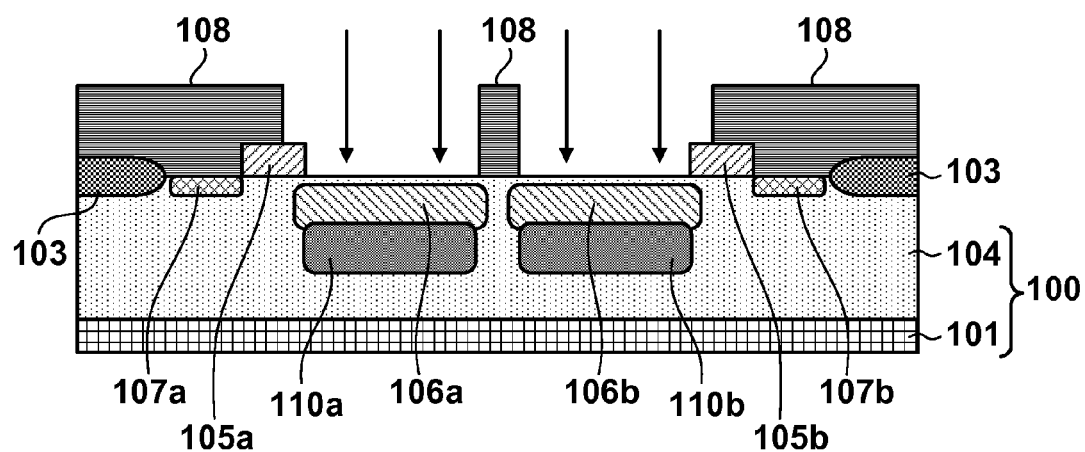
FIG. 5 is a sectional view for explaining a method of manufacturing a solid-state image sensor according to the second embodiment of the present invention.

That is, in the second embodiment, the charge accumulation region forming step includes a first implantation step shown in FIG. 4A, a second implantation step shown in FIG. 4B, and a third implantation step shown in FIG. 5. Note that the procedure of execution of the first, second, and third implantation steps can be determined freely. In the third implantation step shown in FIG. 5, ions are implanted into a region deeper than that into which ions are implanted in the first and second implantation steps. In the third implantation step, a charge accumulation region 110a is formed below a first charge accumulation region 106a, while a charge accumulation region 110b is formed below a second charge accumulation region 106b. Note that the first charge accumulation region 106a and second charge accumulation region 106b can be referred to as upper charge accumulation regions hereinafter, while the charge accumulation regions 110a and 110b formed below them can be referred to as lower charge accumulation regions hereinafter.

The angle of the ion implantation direction in the third implantation step with respect to a normal to the surface of a well 104 of a semiconductor substrate 100 is smaller than that of the ion implantation direction in the first and second implantation steps with respect to the normal. For example, the ion implantation direction in the third implantation step can be parallel to the normal. The first charge accumulation region 106a and second charge accumulation region 106b can be formed by two ion implantation operations having different implantation directions, while the charge accumulation regions 110a and 110b can be formed by one ion implantation operation. Hence, the widths of the first charge accumulation region 106a and second charge accumulation region 106b can be larger than those of the charge accumulation regions 110a and 110b.

Figure 6A:
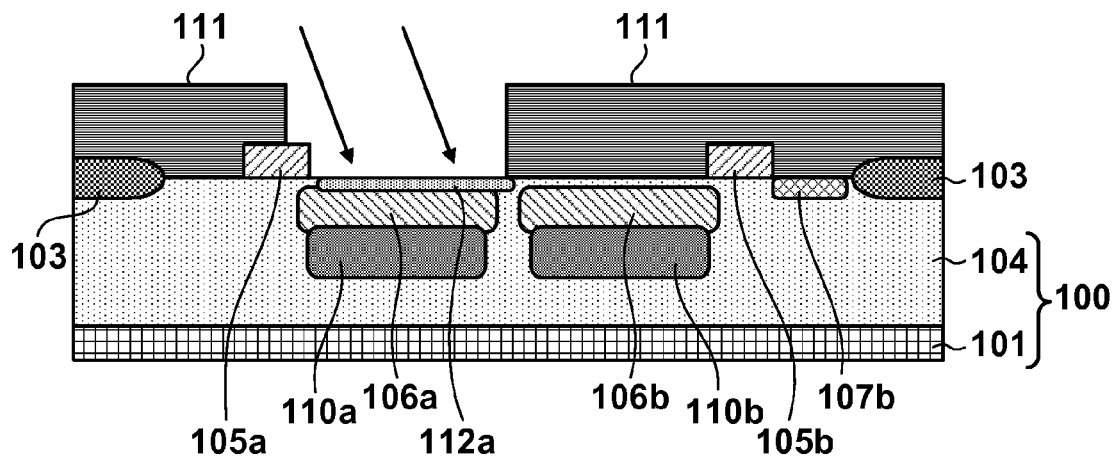
FIGS. 6A to 6C are sectional views for explaining a method of manufacturing a solid-state image sensor according to the third embodiment of the present invention.
Figure 6B:
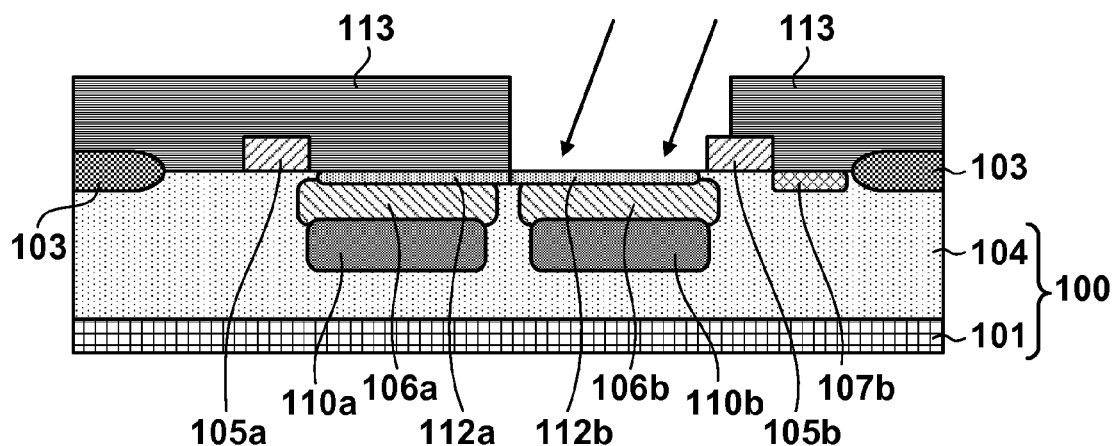

The third embodiment of the present invention will be described with reference to FIGS. 6A to 6C, 7A, and 7B. The third embodiment is a modification to the first or second embodiment, and details which are not particularly referred to herein can be the same as in the first or second embodiment. In the third embodiment, a surface layer forming step shown in FIGS. 6A and 6B is provided. The surface layer forming step can be executed, for example, after or before the charge accumulation region forming step in the first or second embodiment.

More specifically, in the surface layer forming step shown in FIGS. 6A and 6B, a first surface layer 112a is formed on the region where a first charge accumulation region 106a is formed, while a second surface layer 112b is formed on the region where a second charge accumulation region 106b is formed. Note that the first surface layer 112a and second surface layer 112b have the second conductivity type, which is opposite to the first conductivity type, that is, the conductivity type of the first charge accumulation region 106a and second charge accumulation region 106b.

First, in the step shown in FIG. 6A, a mask pattern 111 is formed on a semiconductor substrate 100. The mask pattern 111 can be formed by, for example, the photolithography step. Ions (boron ions in this example) for forming a region of the second conductivity type are implanted into the region on the first charge accumulation region 106a through the opening in the mask pattern 111. With this operation, the first surface layer 112a is formed. In the step shown in FIG. 6B, a mask pattern 113 is formed on the semiconductor substrate 100. The mask pattern 113 can be formed by, for example, the photolithography step. Ions (boron ions in this example) for forming a region of the second conductivity type are implanted into the region on the second charge accumulation region 106b through the opening in the mask pattern 113. With this operation, the second surface layer 112b is formed. Note that in a plan view when viewed from the direction of a normal line to the surface of the semiconductor substrate 100, ion implantation can be done in a direction inclined with respect to that of the normal line so as to separate the first surface layer 112a from the side surface on the side of the first surface layer 112a of a first transfer gate 105a. Similarly, in a plan view when viewed from the direction of a normal line to the surface of the semiconductor substrate 100, ion implantation can be done in a direction inclined with respect to that of the normal line so as to separate the second surface layer 112b from the side surface on the side of the second surface layer 112b of a second transfer gate 105b. This can be achieved by forming a first surface layer 112a and second surface layer 112b in different steps.

As described above, a photoelectric converter having a surface layer of a conductivity type opposite to that of the charge accumulation region on the charge accumulation region is called the buried type. Buried type photoelectric conversion is advantageous in terms of reducing noise due to a dark current generated by the surface of a semiconductor substrate. Although the first surface layer 112a and second surface layer 112b may be separated from each other, they are desirably connected to each other. For example, the first surface layer 112a and second surface layer 112b may be formed to partially overlap each other. In this case, a region with a high impurity concentration can be formed between the first surface layer 112a and the second surface layer 112b. An arrangement which connects the first surface layer 112a and second surface layer 112b to each other is advantageous in terms of improving electrical isolation between the first charge accumulation region 106a and the second charge accumulation region 106b. When, for example, a phase difference for focus detection is detected using the first charge accumulation region 106a and second charge accumulation region 106b, an improvement in electrical isolation between the first charge accumulation region 106a and the second charge accumulation region 106b contributes to an improvement in detection accuracy of a phase difference.

Figure 6C:
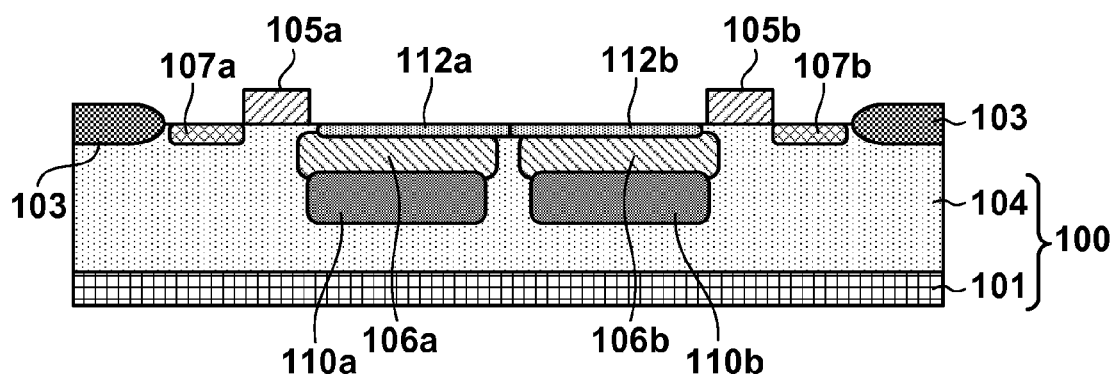

In the step shown in FIG. 6C, a first charge-voltage converter 107a and a second charge-voltage converter 107b are formed. More specifically, as in the step shown in FIG. 4C, a resist pattern is formed on the semiconductor substrate 100 by the photolithography step to implant ions for forming a region of the first conductivity type into a semiconductor substrate 100 (well 104) through the opening in the resist pattern. With this operation, the first charge-voltage converter 107a and second charge-voltage converter 107b are formed.

Figure 7A:
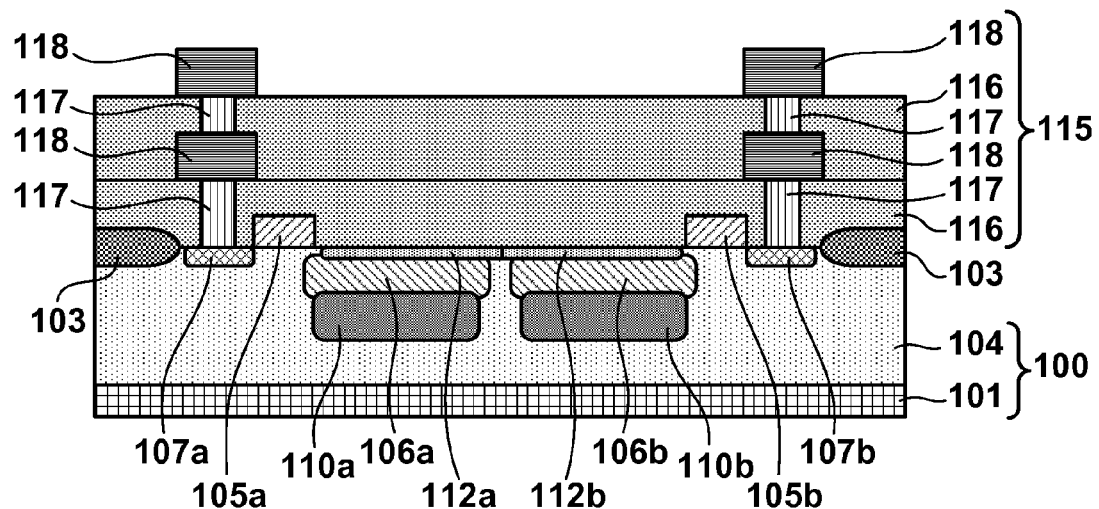
FIGS. 7A and 7B are sectional views for explaining a method of manufacturing a solid-state image sensor according to the third embodiment of the present invention.
Figure 7B:
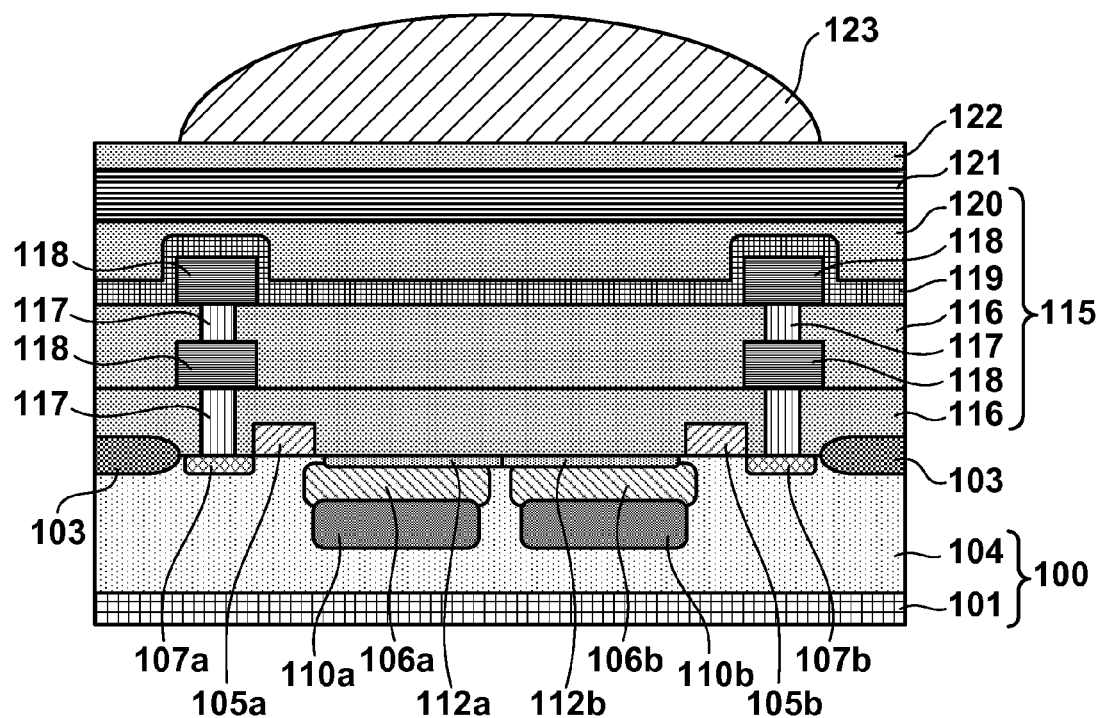

The step shown in FIGS. 7A and 7B can be executed. In the step shown in FIG. 7A, first, an interlayer dielectric film 116 (for example, a BPSG layer) is formed on the semiconductor substrate 100. The CMP step is executed to planarize the interlayer dielectric film 116. A mask pattern for forming a contact hole in the planarized interlayer dielectric film 116 is formed on the interlayer dielectric film 116. A contact hole 117 is formed by etching the interlayer dielectric film 116 using the resist pattern as an etching mask. After the contact hole 117 is filled with a conductor (for example, tungsten), a metal film (for example, aluminum) is formed on the interlayer dielectric film 116. A mask pattern for patterning the conductor is formed on the metal film, and used to form a metal interconnection pattern 118 by etching the metal film. By repeating the above-mentioned processing, a stacked interconnection structure 115 is formed.

In the step shown in FIG. 7B, a passivation film 119 is formed on the stacked interconnection structure 115, and a planarizing layer 120 (for example, an acrylic material layer) is applied on it to form a color filter 121 on it. Moreover, a planarizing layer 122 (for example, an acrylic material layer) is applied on the color filter 121, and a lens material is applied on it to form a microlens 123 by patterning and annealing the lens material. Note that the microlens 123 can be formed commonly to the first charge accumulation region 106a and second charge accumulation region 106b. Such an arrangement is advantageous in detecting a phase difference for focus detection using the first charge accumulation region 106a and second charge accumulation region 106b. Although an organic material such as an acrylic material is used for a planarizing layer, a color filter, or a microlens in this embodiment, an inorganic material may be used.

An exemplary camera which incorporates a solid-state image sensor according to each of the above-mentioned embodiments will be described as an application example of the solid-state image sensor. The concept of a camera includes not only an apparatus which performs photography as the main purpose, but also an apparatus (for example, a personal computer or a portable terminal) having a photographing function as an auxiliary function. The camera includes a solid-state image sensor according to the present invention exemplified as the above-mentioned embodiment, and a processing unit which processes a signal output from the solid-state image sensor. The processing unit can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-206314, filed Sep. 19, 2012, which is hereby incorporated by reference herein in its entirety.

What is claimed is:

1. A method of manufacturing a solid-state image sensor including a first charge accumulation region, a second charge accumulation region positioned adjacent to the first charge accumulation region, a first transfer gate positioned adjacent to the first charge accumulation region and configured to transfer a charge in the first charge accumulation region, and a second transfer gate positioned adjacent to the second charge accumulation region and configured to transfer a charge in the second charge accumulation region, the first accumulation region and the second accumulation region being positioned between a region below the first transfer gate and a region below the second transfer gate, the method comprising:

preparing a semiconductor substrate provided with the first transfer gate and the second transfer gate;

forming, on the semiconductor substrate, a mask pattern including a first opening for implanting ions into a first region where the first charge accumulation region is to be formed, a second opening for implanting ions into a second region where the second charge accumulation region is to be formed, and a wall portion which is positioned between the first opening and the second opening, the first region including a first portion which is arranged below the first transfer gate, and the second region including a second portion which is arranged below the second transfer gate; and implanting ions into the semiconductor substrate through the first opening and the second opening to form the first charge accumulation region and the second charge accumulation region, wherein the implanting ions into the semiconductor substrate includes:

a first implantation of implanting ions into a part of the first region, which includes the first portion, and a part of the second region; and a second implantation of implanting ions into a part of the first region, and a part of the second region, which includes the second portion.

2. A method of manufacturing a solid-state image sensor including a first charge accumulation region formed in an active region, a second charge accumulation region, a first transfer gate configured to transfer a charge in the first charge accumulation region, and a second transfer gate configured to transfer a charge in the second charge accumulation region, the method comprising:

preparing a semiconductor substrate provided with the first transfer gate and the second transfer gate;

forming, on the semiconductor substrate, a mask pattern including a first opening configured to implant ions into a region where the first charge accumulation region is to be formed, a second opening configured to implant ions into a region where the second charge accumulation region is to be formed, and a wall portion which is positioned between the first opening and the second opening, and is positioned on the active region; and implanting ions into the semiconductor substrate through the first opening and the second opening to form the first charge accumulation region and the second charge accumulation region, wherein the implanting ions into the semiconductor substrate includes:

a first implantation of implanting ions into the semiconductor substrate so as to implant ions into a portion below the first transfer gate;

a second implantation of implanting ions into the semiconductor substrate so as to implant ions into a portion below the second transfer gate in a direction different from a direction of the first implantation; and a third implantation of implanting ions into a region deeper than a region into which ions are implanted in the first implantation and the second implantation,
wherein an angle of an ion-implantation direction in the third implantation with respect to a normal line to a surface of the semiconductor substrate is smaller than an angle of an ion-implantation direction in the first implantation and the second implantation with respect to the normal line.

3. The method according to claim 1, further comprising forming a first surface layer of a conductivity type opposite to a conductivity type of the first charge accumulation region on a region where the first charge accumulation region is formed, and forming a second surface layer of a conductivity type opposite to a conductivity type of the second charge accumulation region on a region where the second charge accumulation region is formed, and
the forming the first surface layer and the second surface layer includes forming a mask pattern for forming the first surface layer, and forming a mask pattern for forming the second surface layer.

4. A method of manufacturing a solid-state image sensor including a first charge accumulation region formed in an active region, a second charge accumulation region formed in the active region, a first transfer gate configured to transfer a charge in the first charge accumulation region, and a second transfer gate configured to transfer a charge in the second charge accumulation region, the method comprising:
preparing a semiconductor substrate provided with the first transfer gate and the second transfer gate;
forming, on the semiconductor substrate, a mask pattern including a first opening configured to implant ions into a region where the first charge accumulation region is to be formed, a second opening configured to implant ions into a region where the second charge accumulation region is to be formed, and a wall portion which is positioned between the first opening and the second opening, and is positioned on the active region;
implanting ions into the semiconductor substrate through the first opening and the second opening to form the first charge accumulation region and the second charge accumulation region, wherein implanting ions into the semiconductor substrate includes a first implantation of implanting ions into the semiconductor substrate so as to implant ions into a portion below the first transfer gate, and a second implantation of implanting ions into the semiconductor substrate so as to implant ions into a portion below the second transfer gate in a direction different from a direction of the first implantation; and
forming a first surface layer of a conductivity type opposite to a conductivity type of the first charge accumulation region on a region where the first charge accumulation region is formed, and forming a second surface layer of a conductivity type opposite to a conductivity type of the second charge accumulation region on a region where the second charge accumulation region is formed,
wherein the forming the first surface layer and the second surface layer includes forming a mask pattern for forming the first surface layer, and forming a mask pattern for forming the second surface layer,
wherein the first surface layer and the second surface layer are formed between a region, where the first charge accumulation region is formed, and a region, where the second charge accumulation region is formed, so that the first surface layer and the second surface layer overlap each other.

5. The method according to claim 1, further comprising forming one microlens common to the first charge accumulation region and the second charge accumulation region.

6. The method according to claim 1, wherein an interval between the first charge accumulation region and the second charge accumulation region falls within a range of 0.3 µm to 0.6 µm.

7. The method according to claim 1, wherein the only first charge accumulation region is formed by the implantation through the first opening of the mask pattern, and the only second charge accumulation region is formed by the implantation through the second opening of the mask of the mask pattern.

8. The method according to claim 1, wherein the mask pattern includes a plurality of openings for forming a plurality of charge accumulation regions including the first and second charge accumulation regions, and
wherein the number of the plurality of openings of the mask pattern is the same with the number of the plurality of charge accumulation regions.

* * * * *